(12) United States Patent
Bindrich

(10) Patent No.: US 10,431,405 B2
(45) Date of Patent: Oct. 1, 2019

(54) SWITCHING DEVICE COMPRISING A VACUUM TUBE

(71) Applicant: Siemens Aktiengesellschaft, Munich (DE)

(72) Inventor: Martin Bindrich, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/749,155

(22) PCT Filed: May 23, 2016

(86) PCT No.: PCT/EP2016/061548
§ 371 (c)(1),
(2) Date: Jan. 31, 2018

(87) PCT Pub. No.: WO2017/041913
PCT Pub. Date: Mar. 16, 2017

(65) Prior Publication Data
US 2018/0218861 A1 Aug. 2, 2018

(30) Foreign Application Priority Data

Sep. 11, 2015 (DE) .......................... 10 2015 217 403

(51) Int. Cl.
*H01H 1/22* (2006.01)
*H01H 1/54* (2006.01)
(Continued)

(52) U.S. Cl.
CPC ....... *H01H 33/666* (2013.01); *G01R 31/3274* (2013.01); *H01H 1/221* (2013.01); (Continued)

(58) Field of Classification Search
CPC ...... H01H 33/666; H01H 33/59; H01H 1/221; H01H 1/54; H01H 1/50; H01H 3/32; (Continued)

(56) References Cited

U.S. PATENT DOCUMENTS 4,034,264 A * 7/1977 Muller .................. H01H 33/66
361/2
4,497,990 A 2/1985 Peche et al.
(Continued)

FOREIGN PATENT DOCUMENTS

CN 101379579 A 3/2009
CN 103247458 A 8/2013
(Continued)

OTHER PUBLICATIONS

International Search Report PCT/ISA/210 for International Application No. PCT/EP2016/061548 dated Sep. 27, 2016.
(Continued)

*Primary Examiner* — Amy Cohen Johnson
*Assistant Examiner* — William A Bolton
(74) *Attorney, Agent, or Firm* — Harness, Dickey & Pierce, P.L.C.

(57) ABSTRACT

Disclosed is a switching device comprising a vacuum tube and an adjustable drive for opening and closing the contacts of the switching device. The switching device also comprises a sensor for detecting physical properties of the operating site of the switching device. The detected physical property adapts the adjustable drive for opening and closing the contacts to the operating site.

18 Claims, 2 Drawing Sheets

(51) Int. Cl.
*H01H 3/32* (2006.01)
*H01H 33/666* (2006.01)
*H01H 47/22* (2006.01)
*G01R 31/327* (2006.01)

(52) U.S. Cl.
CPC .............. *H01H 1/54* (2013.01); *H01H 47/22* (2013.01); *H01H 2003/323* (2013.01)

(58) Field of Classification Search
CPC ........ H01H 9/56; H01H 47/325; H01H 47/22; G01R 31/3274
USPC ......... 218/118, 120, 122, 140; 361/160, 139
See application file for complete search history.

(56) References Cited

U.S. PATENT DOCUMENTS

| | | | | |
|---|---|---|---|---|
| 5,449,868 | A * | 9/1995 | Monson | H01H 33/666 218/118 |
| 5,679,986 | A | 10/1997 | Iversen | |
| 6,023,404 | A * | 2/2000 | Marmonier | H01H 11/0062 361/116 |
| 6,354,161 | B1 * | 3/2002 | Patel | H01H 11/0062 73/865.9 |
| 7,473,863 | B2 * | 1/2009 | Schreiber | H01H 33/027 218/138 |
| 7,499,255 | B2 | 3/2009 | Domo et al. | |
| 7,593,211 | B2 * | 9/2009 | Maclennan | H01H 33/666 361/160 |
| 2003/0123212 | A1 | 7/2003 | Dunk | |
| 2006/0126257 | A1 * | 6/2006 | Domo | H01H 33/668 361/139 |
| 2008/0258568 | A1 * | 10/2008 | Finkbeiner | H02K 41/02 310/12.19 |
| 2009/0052107 | A1 | 2/2009 | Maclennan | |
| 2014/0226250 | A1 | 8/2014 | Takeuchi | |

FOREIGN PATENT DOCUMENTS

| | | |
|---|---|---|
| CN | 204167227 U | 2/2015 |
| DE | 3216251 A1 | 11/1983 |
| DE | 112011105570 T5 | 5/2014 |
| EP | 0355817 A2 | 2/1990 |

OTHER PUBLICATIONS

Written Opinion of the International Searching Authority PCT/ISA/237 for International Application No. PCT/EP2016/061548 dated Sep. 27, 2016.
German Search Report 102015217403.4 dated May 19, 2016.
Office Action for Chinese Patent Application No. 201680051994.7 dated Sep. 30, 2018.

* cited by examiner

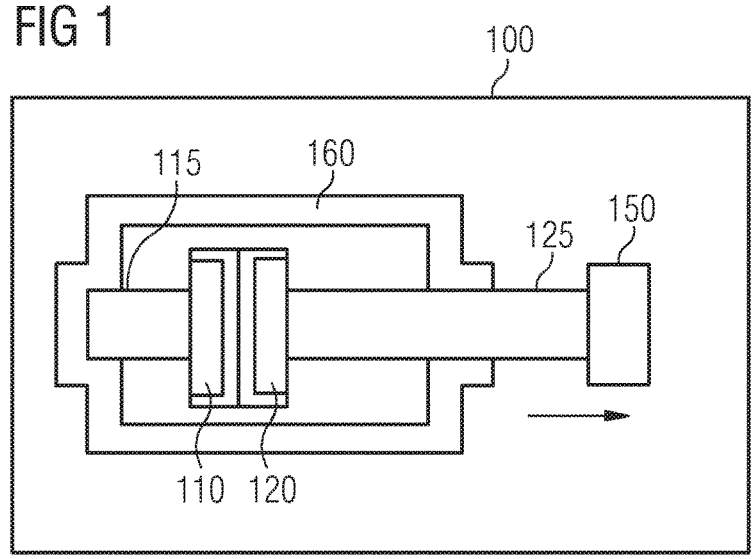
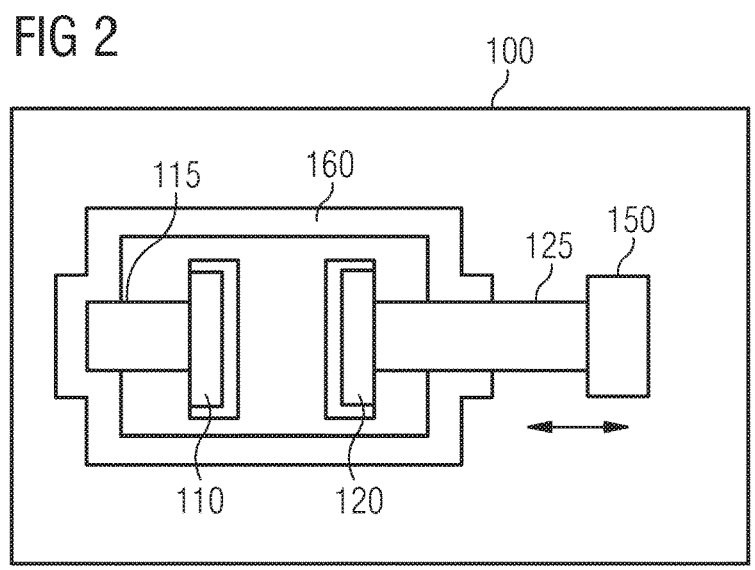
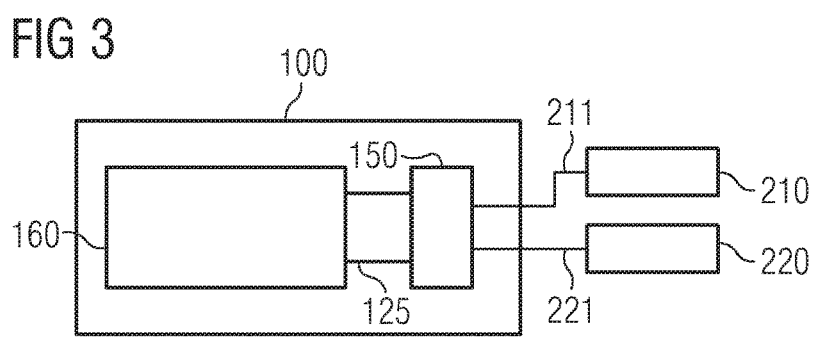

SWITCHING DEVICE COMPRISING A VACUUM TUBE

PRIORITY STATEMENT

This application is the national phase under 35 U.S.C. § 371 of PCT International Application No. PCT/EP2016/061548 which has an International filing date of May 23, 2016, which designated the United States of America and which claims priority to German patent application number DE 102015217403.4 filed Sep. 11, 2015, the entire contents of which are hereby incorporated herein by reference.

FIELD

An embodiment of the invention generally relates to a switching device comprising a vacuum tube and adjustable drive for opening and closing the contacts of the switching device.

BACKGROUND

Switching devices for switching electric currents can contain vacuum tubes. Document DE 32 16 251 A1 discloses, for example, a vacuum tube for switching an electric current. This vacuum tube contains a movable contact and a fixed contact, which contacts can be separated from one another in order to switch off the electric current and which can be placed in contact in order to switch on the electric current.

The switching qualities of such a switching device comprising a vacuum tube, such as are used e.g. in power switches or contactors, are usually adapted to the properties of the operating location. For example, in the case of a switching device with vacuum tubes the switching course therefore depends on the air pressure and therefore on the altitude. A further aspect is the installation direction in which the gravity can act in the direction or counter to the direction of the switching. This speeds up or slows down the circuit. Different switching forces give rise to switching speeds and times which differ from the setpoint value. These ideally have to be ideally corrected.

SUMMARY

At least one embodiment of the invention specifies a switching device comprising a vacuum tube, which device can adapt automatically to the operating location in terms of the properties of the opening and closing of the switching device.

At least one embodiment of the invention is directed to a switching device comprising a vacuum tube and an adjustable drive. Advantageous refinements of the switching device according to the invention are specified in the claims.

The switching device according to at least one embodiment of the invention comprising a vacuum tube and an adjustable drive for opening and closing the contacts of the switching device comprises a sensor for detecting physical properties of the operating location of the switching device, and in which the detected physical property adapts the adjustable drive for opening and closing the contacts to the operating location.

BRIEF DESCRIPTION OF THE DRAWINGS

The abovementioned properties, features and advantages of this invention as well as the way in which they are achieved become clearer and more easily comprehensible in conjunction with the following description of the exemplary embodiments which are explained in more detail in conjunction with the figures, in which:

FIG. 1 shows a switching device comprising a vacuum tube with closed contacts;

FIG. 2 shows a switching device comprising a vacuum tube with opened contacts;

FIG. 3 shows a switching device comprising a vacuum tube and sensors; and

DETAILED DESCRIPTION OF THE EXAMPLE EMBODIMENTS

Figure 4A:
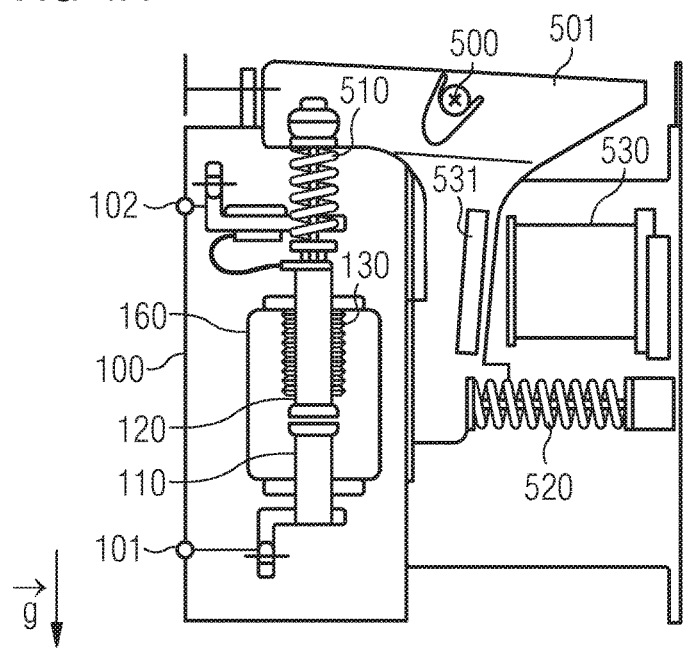
FIGS. 4A/4B show a switching device comprising a vacuum tube and adjustable drive.

The switching device according to at least one embodiment of the invention comprising a vacuum tube and an adjustable drive for opening and closing the contacts of the switching device comprises a sensor for detecting physical properties of the operating location of the switching device, and in which the detected physical property adapts the adjustable drive for opening and closing the contacts to the operating location.

It is advantageous that such a switching device of at least one embodiment can be used at operating locations with highly fluctuating physical properties.

In refinements of example embodiments, the sensor can be a sensor for measuring the air pressure or a sensor for measuring the position of the switching device.

It is advantageous in at least one example embodiment that such a switching device can be used, for example, at an operating location with highly fluctuating pressure conditions. This can be, for example, an elevator in a mine shaft in which pressure conditions fluctuate owing to the change in altitude. It is also advantageous that in the case of switching devices which are pivoted during operation, as can be the case, for example, in cranes, the switching device can also be adapted to the operating position.

In a further refinement in at least one example embodiment, the force acting on the contacts is adapted to the operating location by the adjustable drive for opening and closing.

In a further refinement in at least one example embodiment, the adjustable drive for opening and closing comprises a coil which serves for the electromagnetic adjustment of the switch force by the adjustable drive for opening and closing. The force of the adjustable drive for opening and closing can be adapted here by controlling the current.

In an alternative refinement in at least one example embodiment, the adjustable drive for opening and closing comprises at least one spring whose variable spring force serves to adjust the force acting on the contacts by the adjustable drive for opening and closing. In this context, the force of the drive for opening and closing the contacts can be adapted by changing the length of the spring travel.

In a further refinement in at least one example embodiment, the force of the drive for opening and closing the contacts is dynamically adapted while the switching device is operated. The contact force can be adapted dynamically to the operating location while the switching device is operating.

FIG. 1 illustrates a switching device 100 comprising a vacuum tube 160 and an adjustable drive 150 for opening and closing the contacts 110; 120 of the switching device 100. The vacuum tube 160 comprises a fixed contact 110 which is mounted on a pin 115, and a movable contact 120 which can be moved by means of a pin 125. According to the illustration in FIG. 1, the contacts 110; 120 are in the closed position, with the results that a current can flow.

The switching device 100 comprises a drive 150 for opening and closing the contacts 110; 120. According to the illustration in FIG. 1, this drive 150 can move the moveable contact 120 to the right in the direction of the arrow in order to open the contacts 110; 120.

This is illustrated in more detail in FIG. 2 in which the fixed contact 110 is separated from the movable contact 120. The adjustable drive 150 has separated the contacts 110; 120.

Figure 4B:
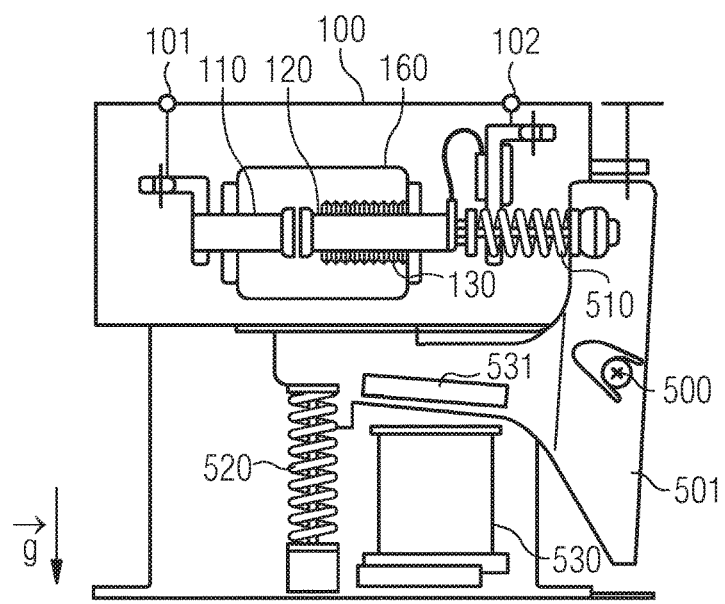

The switching device 100 is illustrated in more detail in FIGS. 4A and 4B. In addition to the contacts 110; 120, the vacuum tube 160 comprises a folding bellows 130 which ensure that the movable contact 120 is sealed. The switching device 110 is typically adjusted in such a way that the force of the folding bellows 130 acting on the pin 125 is opposite and equal to the external force owing to the pressure difference between the vacuum in the vacuum tube 160 and the operating location.

FIGS. 4A and 4B additionally illustrate the externally electrical contacts 101; 102 to which the current path of the consumer to be switched is connected.

The adjustable drive 150 for opening and closing the contacts 110; 120 comprises an armature 501 which is mounted so as to be rotatable about an axis 500. According to the illustration in FIGS. 4A and 4B, the contacts 110; 120 are opened, and therefore moved apart from one another. By means of a movement of the armature in the counterclockwise direction corresponding to the illustration in FIG. 4A, the movable contact 120 is moved toward the fixed contact 110, and the electrical current path of the switching device 100 is therefore closed.

The adjustable drive 150 also comprises a spring 510 which ensures that in the closed state the contacts 110; 120 are pressed against one another with a defined force. In addition, the drive 150 comprises an electromagnet with a coil 530 which acts on an opposing piece 531 on the armature 501 and rotates the armature in the counterclockwise direction by applying a coil current. As a result of this rotation, the electrical contact of the switching device 100 is closed. Furthermore, the drive comprises an opening spring 520 which opens the contacts when the electromagnet of the coil 530 is switched off.

According to the position of the switching device 100, different forces act on the armature and different forces have to be applied by the armature in order to close the switching device 100. This is illustrated, for example, in FIG. 4B, which figure illustrates the electrical switch 100 from FIG. 4A rotated through 90°. In such a configuration, other forces act on the armature owing to gravity G, with the result that a different adjustment of the drive 150 is necessary here. Likewise, a change in the air pressure acts on the force with which the movable contact 120 has to be pressed against the fixed contact 110 in order, for example, to hold the contact during the flow of current.

FIG. 3 illustrates that the switching contact 100 additionally comprises sensors 210; 220, for detecting physical properties of the operating location of the switching device 100. The detected properties adapt the adjustable drive 150 for opening and closing the contacts 110; 120 to the operating location.

The sensor 210 can be, for example, a sensor for measuring the air pressure; the sensor 220 can be, for example, a sensor for measuring the position of the switching device 100. The sensor 210 is connected via a line 211 to the drive 150 for opening and closing the contacts 110; 120. In order to adapt the adjustable drive 150 to the operating location, the latter can comprise a microcontroller which evaluates the signal of the sensor and performs the necessary adjustments. Alternatively, the control can also be performed separately from the drive 150.

Likewise, the sensor 220 is connected via the line 221 to the adjustable drive 150 for opening and closing the contacts 110; 120. The adaptation of the adjustable drive 150 for opening and closing to the operating location is performed by adapting the switching force to the contacts 110; 120. If the switching contact contains for this purpose a coil 530 such as is illustrated in FIGS. 4A and 4B, the force acting on the contacts 110; 120 can be implemented by changing the coil current. For this purpose, the electrical signals of the sensors 210; 220 which correspond to the physical properties are evaluated and the coil current is correspondingly adapted.

It is likewise possible to adapt the spring forces of the spring 510; 520. This can be done, for example, by means of an electromechanical drive which adapts the lengths of the spring travel values of the springs 510; 520.

The adaptation of the force of the drive 150 for opening and closing the contacts 110; 120 and the force of the contact pressure spring 510 and of the opening spring 520 can be dynamic. This means that the force is adapted dynamically during operation. For example, it can therefore be ensured that in the case of changes in, for example, the pressure, as is the case, for example, in a mine elevator, the force acting on the contacts 110; 120 is always dynamically adapted and therefore kept constant.

By detecting the ambient conditions, e.g. by means of a sensor for measuring the air pressure or a sensor for measuring the position of the switching device 100, the electronic control device can adapt the switching properties of the current ambient situation. By increasing the coil current or changing the spring constant of the springs 510; 520 with respect to the normal value it is possible for changes in the ambient conditions to act on the switch 100, with the result that the latter always has a constant triggering value. It is therefore possible for ambient conditions which have an adverse effect on the switching process to be completely compensated. Likewise, positively acting ambient conditions can be compensated, for example by lowering the coil current.

By dynamic adaptation it is possible to permit new applications for which a fixed adaptation of the switching device 100 is unsuitable. For example, in the case of applications in which the switching device 100 is subjected to highly fluctuating pressure conditions or has changing reference positions.

The invention claimed is:

1. A switching device comprising:
   a vacuum tube;
   an adjustable drive configured to open and close contacts of the switching device; and
   a sensor configured to detect a position of the switching device relative to a mounting location at which the switching device is mounted wherein the detected position is used to adjust the adjustable drive, to at least one of open and close the contacts, wherein the sensor for measuring the position of the switching device is configured to detect a change in an angular position of the switching device.

2. The switching device of claim 1, wherein a force acting on the contacts is adapted by the adjustable drive based on an operating location.

3. The switching device of claim 2, wherein the adjustable drive comprises a coil to form an electromagnetic adjustment of the force by the adjustable drive.

4. The switching device of claim 3, wherein the force of the adjustable drive is provided by controlling a coil current.

5. The switching device of claim 2, wherein the adjustable drive is configured to open and close at least one spring whose adjustable spring force serves to adjust the force acting on the contacts via the adjustable drive.

6. The switching device of claim 5, wherein the force acting on the contacts is provided by changing a length of spring travel of the adjustable spring.

7. The switching device of claim 1, wherein the adjustable drive is configured to open and close at least one spring whose adjustable spring force serves to adjust a force acting on the contacts via the adjustable drive.

8. The switching device of claim 7, wherein the force acting on the contacts is provided by changing a length of spring travel of the adjustable spring.

9. The switching device of claim 1, wherein a force for opening and closing the contacts is adapted dynamically according to an elevation change of the switching device while the switching device is operating.

10. The switching device of claim 9, wherein the force is dynamically adapted by the adjustable drive based on the operating location while the switching device is operating.

11. The switching device of claim 1, wherein a force acting on the contacts is adapted by the adjustable drive for opening and closing of the contacts based on an operating location.

12. The switching device of claim 11, wherein the adjustable drive comprises a coil to form an electromagnetic adjustment of the force by the adjustable drive.

13. The switching device of claim 12, wherein the force of the adjustable drive is provided by controlling a coil current.

14. The switching device of claim 1, wherein the adjustable drive comprises a coil to form an electromagnetic adjustment of a force by the adjustable drive.

15. The switching device of claim 14, wherein the force of the adjustable drive is provided by controlling a coil current.

16. The switching device of claim 1, wherein the adjustable drive is configured to open and close at least one spring whose adjustable spring force serves to adjust a force acting on the contacts via the adjustable drive.

17. The switching device of claim 16, wherein the force acting on the contacts is provided by changing a length of spring travel of the adjustable spring.

18. The switching device of claim 1, wherein the sensor is a sensor for measuring air pressure and for measuring the position of the switching device.

\* \* \* \* \*